United States Patent [19]

Worley

[11] Patent Number: 5,017,811
[45] Date of Patent: May 21, 1991

[54] CMOS TTL INPUT BUFFER USING A RATIOED INVERTER WITH A THRESHOLD VOLTAGE ADJUSTED N CHANNEL FIELD EFFECT TRANSISTOR

[75] Inventor: Eugene R. Worley, Irvine, Calif.

[73] Assignee: Rockwell International Corporation, El Segundo, Calif.

[21] Appl. No.: 427,383

[22] Filed: Oct. 27, 1989

[51] Int. Cl.$^5$ .................... H03K 19/94; H03K 19/92; H03K 19/03; H03K 17/14

[52] U.S. Cl. ................................. 307/475; 307/443; 307/451; 307/464

[58] Field of Search .................... 307/296.8, 291, 475, 307/443, 451, 542, 464

[56] References Cited

U.S. PATENT DOCUMENTS 4,471,242  9/1984  Noufer et al. .................... 307/475
4,593,212  6/1986  Svager .................... 307/475
4,612,461  9/1986  Sood .................... 307/475

Primary Examiner—Stanley D. Miller
Assistant Examiner—David R. Bertelson
Attorney, Agent, or Firm—H. Fredrick Hamann; George A. Montanye; Wilfred G. Caldwell

[57] ABSTRACT

The invention applies a weak forward bias to the body of the NFET transistor of a PFET-NFET TTL inverter buffer circuit to lower the NFET threshold voltage by about 0.45 volts, as a result of 1.5μ amps of body-source current providing a body to source voltage of about 0.5 volts to achieve a near ideal switch point of 1.45 volts under nominal conditions. Also a modified inverter circuit with biasing source, two diodes for trip voltage of 1.4 volts and a comparator constitute a central bias generator for supplying proper bias to the body of the NFETs of a plurality of TTL input buffers.

7 Claims, 5 Drawing Sheets

CMOS TTL INPUT BUFFER USING A RATIOED INVERTER WITH A THRESHOLD VOLTAGE ADJUSTED N CHANNEL FIELD EFFECT TRANSISTOR

BACKGROUND OF THE INVENTION

1. Field of the Invention

This invention relates to an improved TTL to CMOS buffer, and central bias generator therefor.

2. Prior Art

Ratioed CMOS inverters are commonly used in industry for realizing a TTL to CMOS buffer. The problem is to achieve the ideal switch point of 1.4 volts, but the NFET to PFET conductivity ratio is 16 or greater. The higher the ratio, the lower the power supply sensitivity and the greater the switch point dependency on NFET threshold. By way of example, for a conductivity ratio of 16, the power supply sensitivity of the switch point is 0.2 volts/volt, while the switch point dependency on the PFET threshold is $0.2 \times V_{tp}$ and on the NFET is $0.8 \times V_{tn}$. Since the square root of the conductivity ratio has almost no dependence on temperature, the factor that has the biggest impact on the temperature coefficient of the switch point is the NFET threshold voltage.

Further, radiation hard processes usually have a higher $V_{tn}$ which is an added complication in designing a TTL buffer. In certain SOS processes, the threshold voltage at room temperature is 1.2+ or −0.2 volts. Over the Mil temperature range, the $V_{tn}$ can be as high as 1.53 volts, making it impossible for the switch point to approach the ideal value of 1.4 volts no matter what NFET to PFET conductivity ratio is used.

SUMMARY OF THE PRESENT INVENTION

The subject invention resolves this problem by applying a weak forward bias to the body of the NFET pull down transistor. For an edgeless transistor with a width of 100 micrometers, only 1.5 micro amps of body-source current is required to achieve a body to source voltage of 0.5 volts. This bias voltage lowers the NFET threshold by 0.45 volt. The invention approaches the ideal switch point of 1.4 volts under nominal conditions. By sacrificing an inverter, adding two diodes for trip voltage of 1.4 volts and a comparator, a central bias generator is developed for supplying proper bias to a plurality of TTL input buffer.

DETAILED DESCRIPTION OF PREFERRED EMBODIMENTS

Figure 1:
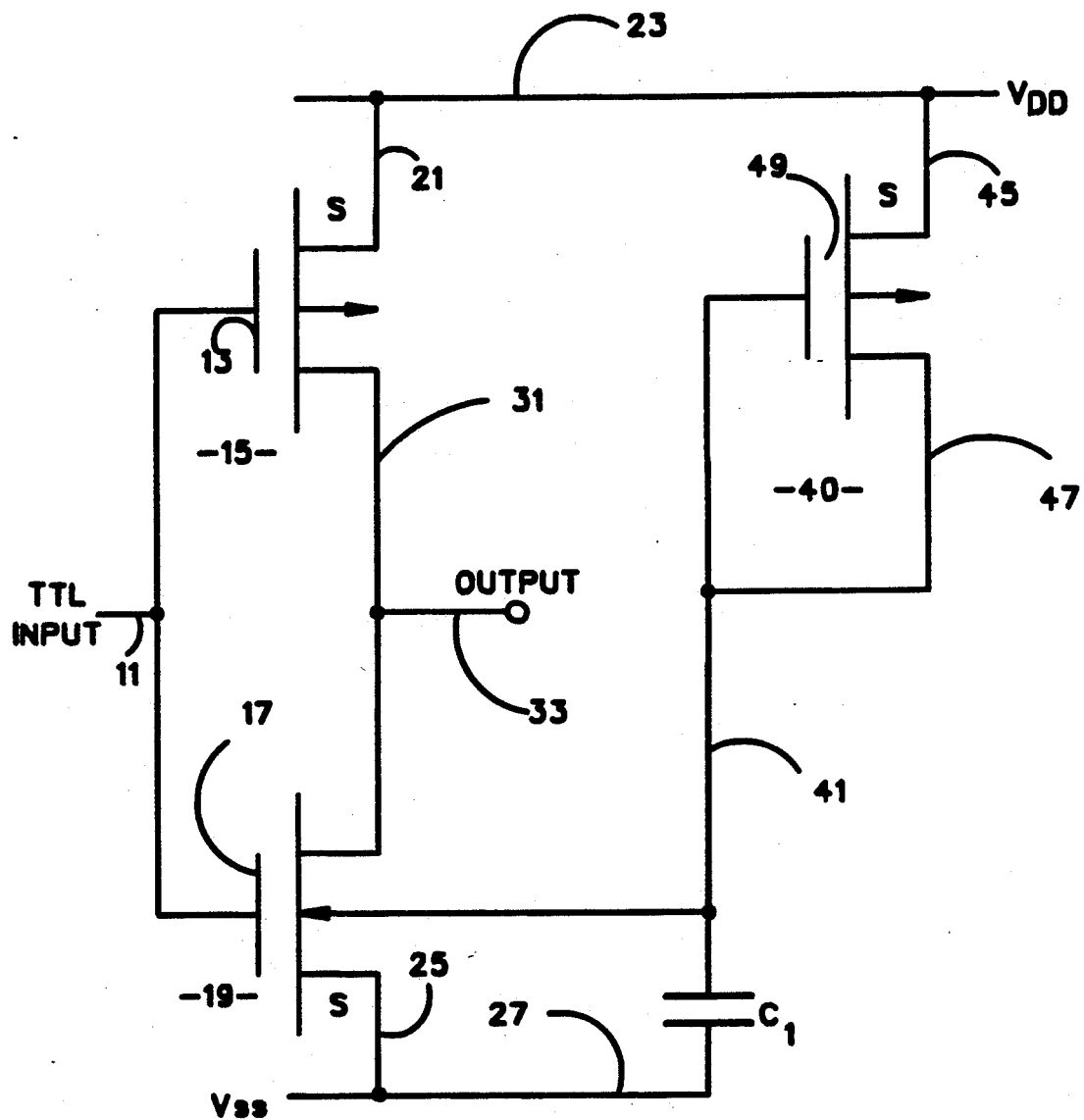
FIG. 1 is a circuit diagram indicating the principle of operation of the present invention in its simplest circuit manifestation.

The simplest preferred embodiment is the circuit shown in FIG. 1 wherein a TTL level input is applied to lead 11, directly connected to the gate 13 of a PFET 15, also directly connected to the gate 17 of an NFET 19.

The source of the PFET 15 is connected over lead 21 to the $V_{DD}$ supply line 23. The source of the NFET 19 is connected over lead 25 to supply line 27 for the $V_{SS}$ supply source. The drain of the PFET 15 is connected over lead 31 to the output lead 33 and the drain of the NFET 19 is connected over lead 35 to the output lead 33.

It may be seen that the PFET 15 and NFET 19 are simply connected as a ratioed inverter circuit.

A biasing source, in the form of, e.g., PFET 40, is provided to apply a tiny current over lead 41 to the body of NFET 19. The source of the PFET biasing source is connected over lead 45 to the $V_{DD}$ source and the drain of the biasing PFET 40 is connected over lead 47 to its own gate 49, thereby forming a constant current source to supply biasing current over the lead 41 to the body portion of the NFET 19. This biasing current may be of the order of 1.5 micro-amps and even 1.0 micro-amps should be sufficient when working with many of these circuits on a chip. The inverter circuit is thus comprised of the pull up PFET 15 and the pull down NFET 19.

Figure 3:
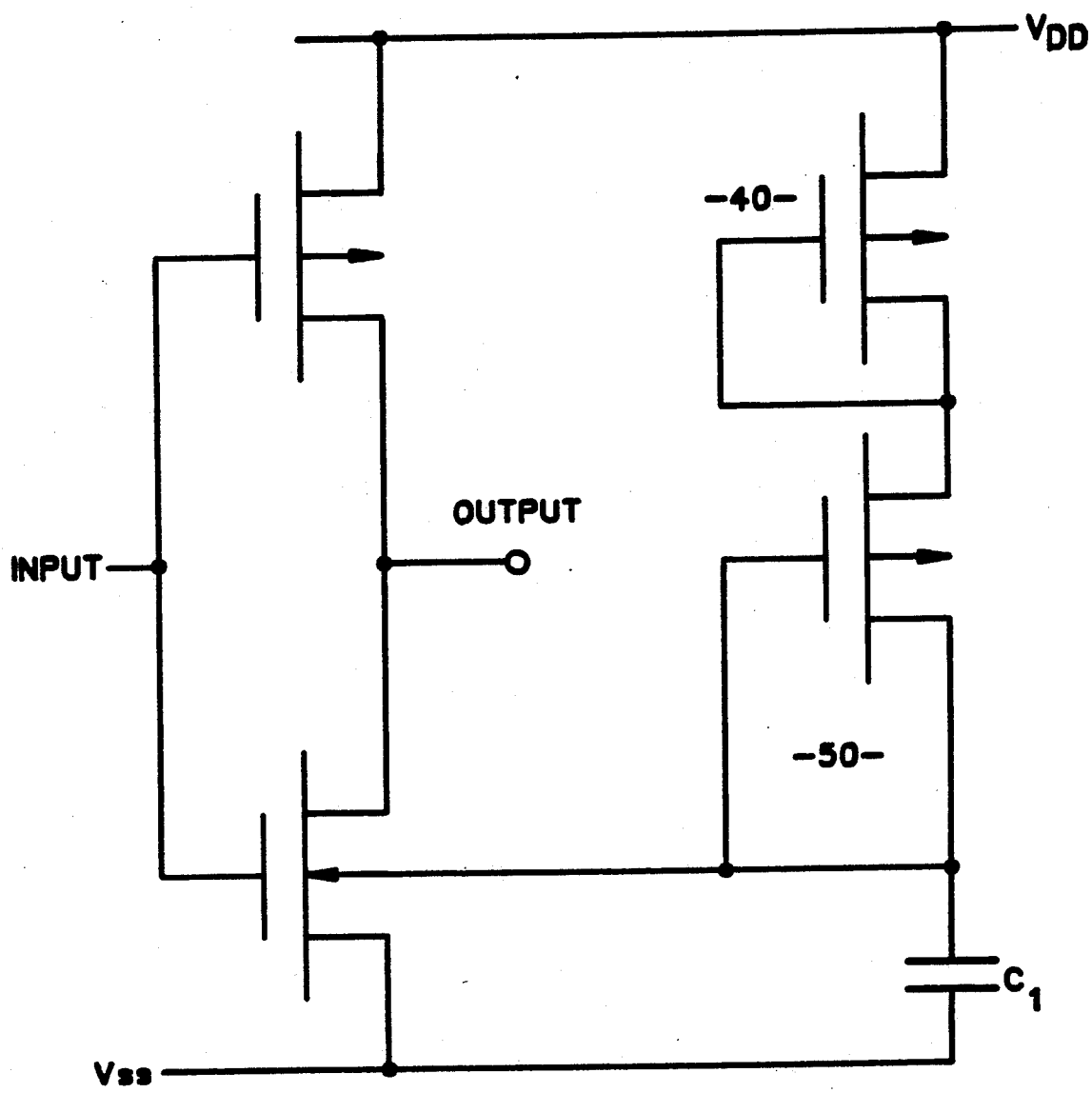
FIG. 3 shows a circuit with a biasing portion improved to more efficiently generate the feeble current necessary for forward biasing while utilizing less real estate.
Figure 4:
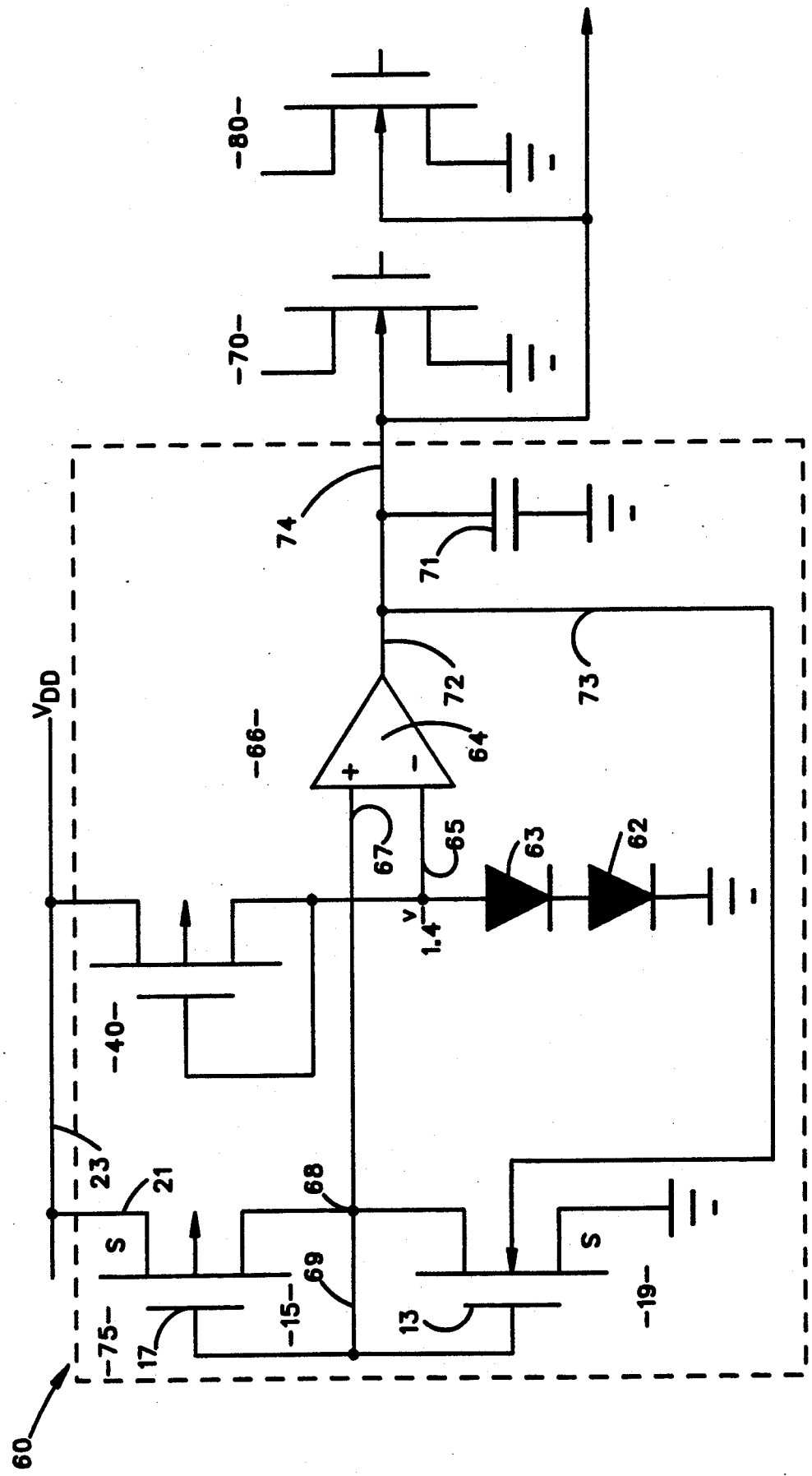
FIG. 4 illustrates a circuit of the invention wherein a plurality of inverters requiring the biasing current or voltage are supplied from a single central bias generator source on a single chip; and, FIG. 5 is a chart of threshold voltage with respect to temperature showing the improvement in voltage-temperature characteristics using the present invention.

Design considerations include the addition of bypass capacitors C1 in FIGS. 1 and 3 and 71 in FIG. 4 since the substrate node has a high impedance and is, therefore, susceptible to bumping by the NFET gate or by adjacent lines SOS. Also, the distributed RC time constant of the substrate has to be considered when determining the frequency with which substrate tie points are made for SOS transistors.

For an edgeless transistor with a width of 100 micrometers, only 1.5 micro amps of body-source current is required to achieve a body to source voltage of 0.5 volts. This bias voltage lowers the NFET threshold by 0.45 volts. The edgeless PFET biasing source 40 has a very low width to length ratio (4 micrometers/350 micrometers) for the circuit of FIG. 1.

By way of example, PFET 15 may be formed by CMOS/SOS conventional processing with a channel width to length ratio of 12μ to 1.6μ and doped approximately $2 \times 10^{16}$ atoms per c.c. NFET 19 is formed by the same processing with a W/L ratio of 96μ to 1.6μ and a channel doping of about $1 \times 10^{17}$ atoms/c.c. Otherwise, the Engineer may design cells with the sizing being determined by the desired drive. $V_{DD}$ is usually +5 volts and $V_{SS}$ is zero volts or ground.

The body current supplied by biasing PFET 40 has a relatively small impact on the body voltage variation with temperature. See FIG. 5 which plots threshold voltage as the ordinate and temperature as the absissa. The prior art response is indicated by curve A wherein the body of the NFET of the inverter is grounded, i.e., 0.0 volts. It may be seen that the threshold voltage of this device varies from about 1.03 to about 1.32 volts over a temperature swing of −60 to 125 degrees centigrade.

The subject invention provides the relatively constant linear curve B, showing temperature insensitivity over the entire range, wherein the body is biased at about 0.5 volts at 25 degrees C.

Figure 5:
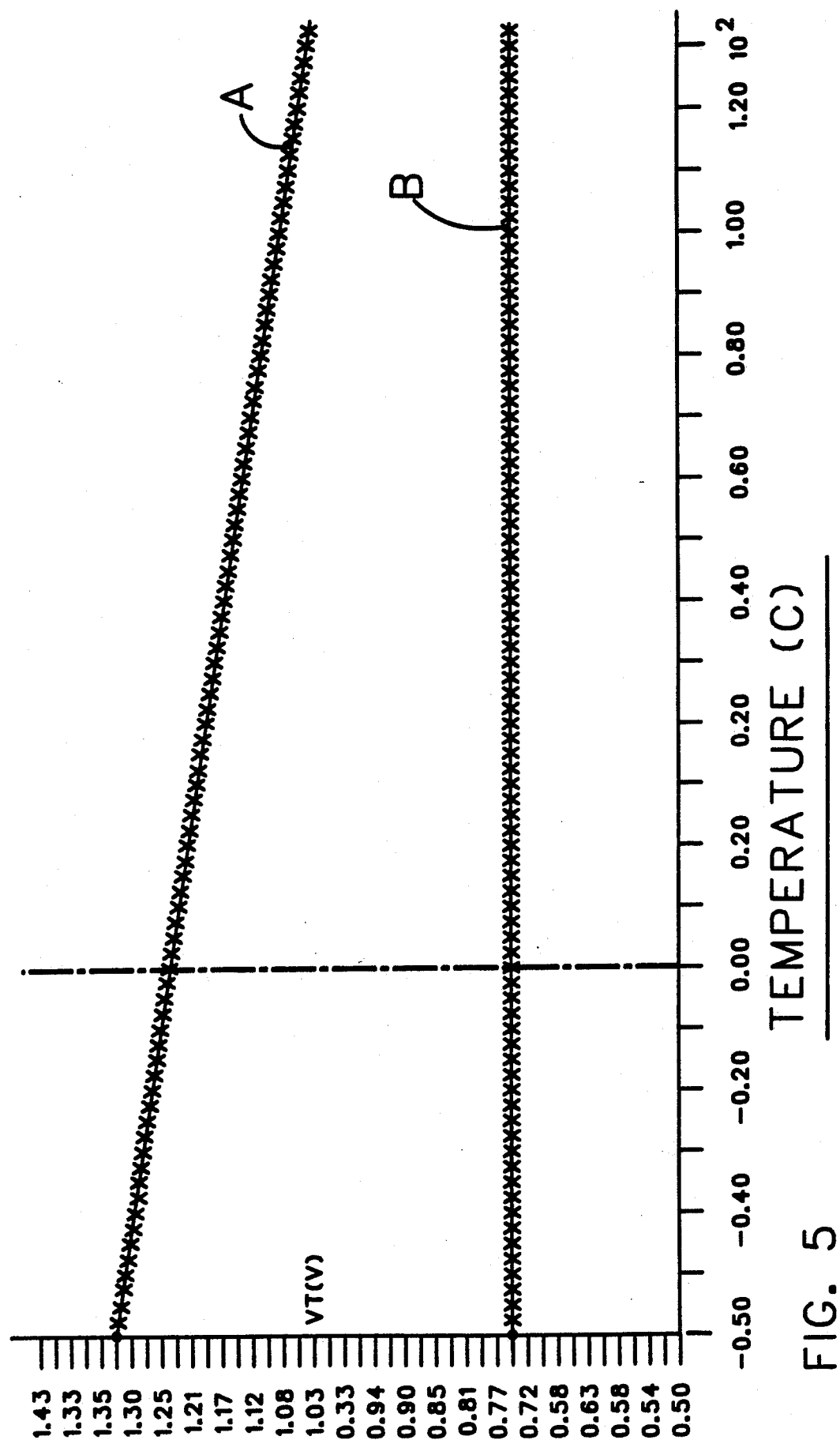

The main component of the temperature variation for the body voltage lies with forward voltage drop of the body to source diode which has a temperature coefficient of about −1.9 millivolts/C. Thus, as the temperature increases, the body voltage decreases, causing the threshold voltage to rise. Compensating for this rise in threshold voltage is the temperature coefficient of the threshold voltage which causes the threshold to decrease. These two competing effects result in the threshold voltage which is relatively stable with temperature. As can be seen in FIG. 5, the threshold variation with temperature is small for the forward biased case when compared with the body grounded case. Thus, not only is the threshold voltage of the NFET lowered by the application of a body-source diode current, but the threshold temperature coefficient approaches 0.

Figure 2:
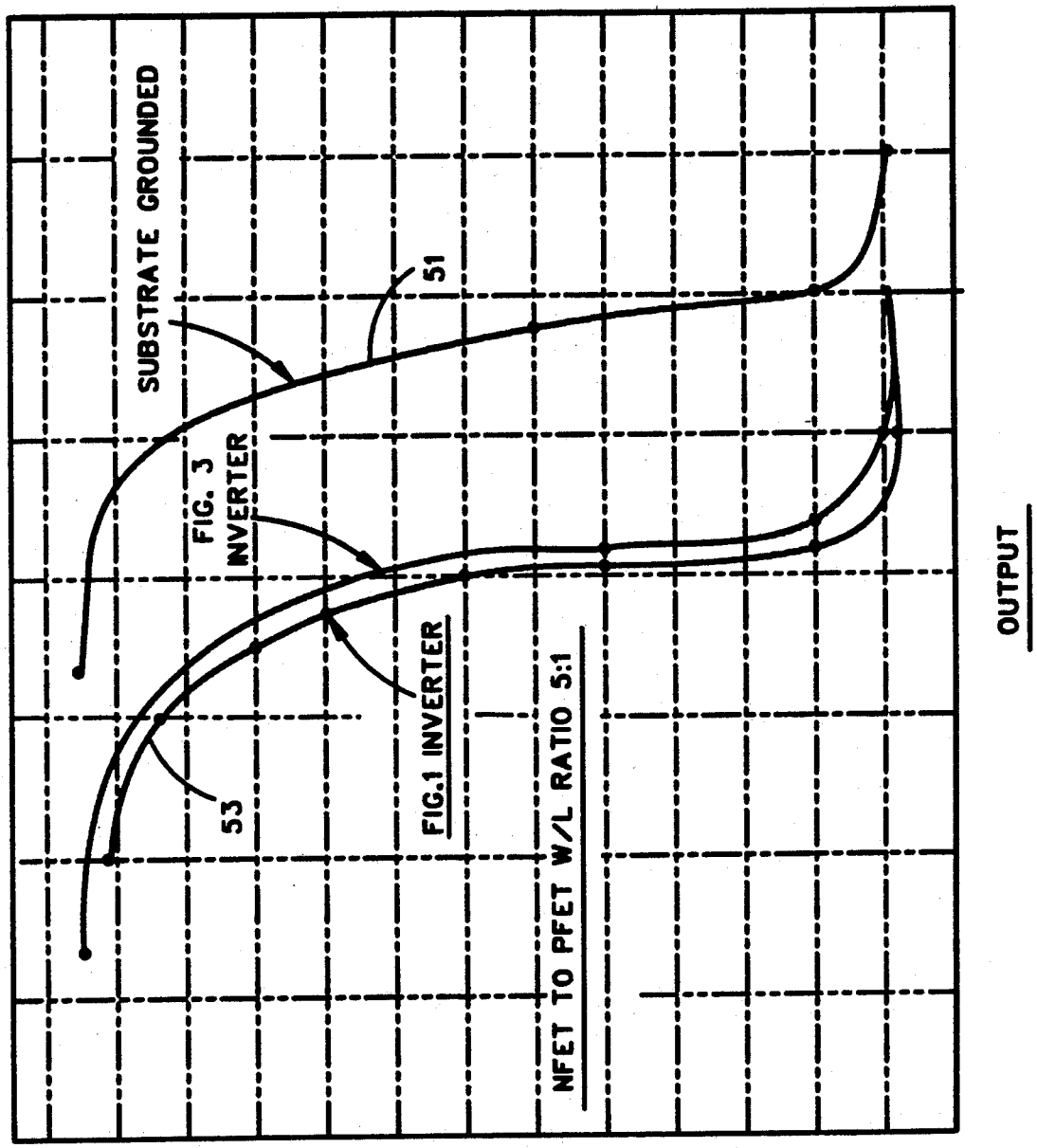
FIG. 2 shows inverter transfer characteristics with the body forward biased to show a shift in the transfer curve from the case where the substrate is grounded.

In FIG. 2 the input voltage is plotted against the output voltage (abscissa) for the inverter of FIG. 1 and FIG. 3 relative to an inverter with the substrate of the NFET grounded. The prior art curve 51 is not ideal because, at room temperature the transfer curve of the TTL input buffer should have its highest gain point at 1.4 volts (approximately 2 diode drops). The reason that the curve 51 is not ideal is because the ratioed inverter requires an N channel threshold voltage of around 0.8 volts. Radiation hard CMOS/SOS processes, however, have NFET threshold voltages close to the ideal switch point or high gain point, making it difficult to design a TTL input buffer.

The solution is illustrated by the curves 53 and 55 (FIG. 2) for the circuits of FIGS. 1 and 3. Because of the body effect of the weak forward bias current, the NFET threshold voltage is lower. Curves 53 and 55 approach the ideal and the only difference is that in FIG. 3 the substrate is tied to two PFETs 40 and 50 in series to result in slightly better temperature stability.

The application of a positive substrate bias to an NFET may also reduce $V_t$ fluctuations due to process variations, since the QB term of the threshold voltage equation is reduced. Experimental data shows that a main contributing factor to $V_t$ fluctuations is variations in substrate doping density. Also, the threshold voltage temperature coefficient is reduced. For a highly ratioed inverter, the threshold voltage of the NFET figures prominently in the location of the trip or switch point.

Another circuit involving the application of a substrate bias voltage is shown in FIG. 4. In this circuit a central biased generator 60 (inside dashed line box) is used to set the bias voltage of the NFET bodies of a number of ratioed inverter TTL buffers located on a common chip. Buffers 70, 80, etc. depict some of the ratioed TTL buffers supplied with proper body bias voltage from this circuitry on the same chip. Two diode voltage drops are used as the trip point reference voltage, i.e., at node 61 above diodes 62 and 63 connected to ground. This reference voltage is fed into one side of a conventional comparator 64 via lead 65.

A reference inverter is attached to the other comparator input via lead 67. Note that in the sacrificed inverter 75 with PFET and NFET 15 and 19, the gates 13 and 17 are also tied to node 68 in the lead between the drain of PFET 15 and the drain of PFET 19, and this node is tied to lead 67 to serve as the positive comparator input. Also, the only input for inverter 75 is $V_{DD}$ by way of the source of PFET 15. The constant current generator, in the form of PFET 40 is used to develop the biasing current for the diode reference circuit. Tying the gates 17 and 13 of the reference inverter to the output terminal 68 by lead 69 causes the inverter to bias itself at the trip point. The comparator 64 then makes adjustments to the body bias voltage, such that the trip is at 1.4 volts due to diodes 62 and 63. Since it can be expected that the NFET characteristics are fairly uniform across the chip, the bias adjusted NFET threshold voltages of the TTL buffer inverters should also be reasonably uniform. Since the comparator is used only to set a DC voltage, it can be designed to consume only a few micro amps. The comparator output at lead 72 is designed to saturate at a fairly low current in order to insure low power consumption. The bias generator circuit should also be useful for radiation hard applications, since the diode voltage reference is relatively immune to total dose ionizing radiation. Bias control lead 73 extends to the body of NFET 19, and bias lead 74 extends to the bodies of buffers 70, 80, etc.

The concept of applying a weak positive voltage to the body of an NFET may also be useful for bulk P-well processes. The post radiation "rebound effect" causes NFET threshold voltages to increase above the initial value, and, therefore a reduction in threshold voltage would be required in this case for proper operation of a TTL buffer inverter.

Experimental data was taken on the buffer of FIG. 1 for both the case in which PFET 40 supplied 1.7 micro amps of current to forward bias the body of NFET 19 and for the case in which the substrate of NFET 19 was grounded. For the forward body bias case, the switch point was found to be 1.45 volts under nominal conditions. The power supply sensitivity was measured at 0.2 volt/volt for a power supply voltage range of 4.5 to 5.5 volts. The worst case temperature variation (−55° to 125° C.) of the switch point was observed to be 80 millivolts at a power supply voltage of 4.5 volts. For the substrate grounded case, the switch point increased to 1.90 volts under nominal conditions, and the temperature variation of the switch point increased to 300 millivolts. Also, the hysteresis observed for the first case was negligible but the hysteresis for the body grounded case was as large as 0.1 volt. This difference can be accounted for by the lower body resistance of the forward biased body. The worst case maximum switch point for the body grounded case was 2.15 volt over temperature and supply voltage whereas the maximum for the forward bias body was 1.60 volts.

What is claimed is:

1. A TTL level input receiver, comprising in combination:
   a ratioed inverter comprising a series connected CMOS PFET and CMOS NFET for receiving a TTL level input and outputting a CMOS level output; and,
   biasing means connected to the body of the NFET to apply a forward bias current for lowering the threshold voltage of the NFET.

2. A TTL level input receiver, comprising in combination:
   a ratioed inverter comprising a series connected CMOS PFET and CMOS NFET for receiving a TTL level input and outputting a CMOS level output;
   biasing means connected to the body of the NFET to apply a forward bias current for lowering the threshold voltage of the NFET;
   the PFET is connected as a pull up device and the NFET is connected as a pull down device; and, said biasing means comprises a CMOS PFET having a width to length ratio of the order of 4:350.

3. The receiver of claim 2, further comprising a bypass capacitor connected to suppress gate bumping of the body voltage via gate to body capacitance.

4. A TTL level input receiver, comprising in combination:
   an inverter comprising a CMOS PFET and a CMOS NFET connected in series between a first source of potential and a second source of potential;
   the gates of the PFET and NFET connected to receive a TTL level input;
   the drain of the PFET connected to the drain of the NFET to provide a CMOS level output; and,
   biasing means connected between the first source of potential and the body of the NFET to apply a forward bias current for lowering the threshold voltage of the NFET.

5. A ratioed inverter biasing apparatus used to bias the NFET bodies of one or more TTL level input receivers, comprising in combination:
   a sacrificial ratioed inverter comprising a series connected CMOS PFET and CMOS NFET having their gates connected together and the drain of the NFET connected to the drain of the PFET;
   biasing means connected to the body of the NFET to apply a forward bias current for lowering the threshold voltage of the NFET;
   said biasing means comprising a two lead input comparator having a first lead input providing 1.4 volts and a second lead input connected to the gates and the connected together PFET drain and NFET drain; and
   said comparator having an output to serve as a biasing supply for said receivers.

6. A central bias generator for at least one TTL level input receiver, comprising in combination:
   an inverter comprising a CMOS PFET and a CMOS NFET connected in series between a first source of potential and a second source of potential;
   the gates of the PFET and NFET connected together;
   the drain of the PFET connected to the drain of the NFET;
   a comparator;
   biasing means connected between the first source of potential and the body of the NFET via the comparator to apply a forward bias current for lowering the threshold voltage of the NFET;
   said comparator further connected to said gates and drains;
   a pair of series connected diodes connected between the second source of potential and the comparator to provide a 1.4 volt output from the comparator for said receivers.

7. The generator of claim 6, further comprising:
   a bypass capacitor connected between the comparator and the second source of potential to suppress gate bumping of the body biasing via gate to body capacitance.

* * * * *